US009202948B2

(12) United States Patent
Lee et al.

(10) Patent No.: US 9,202,948 B2
(45) Date of Patent: Dec. 1, 2015

(54) SOLAR CELL AND METHOD FOR MANUFACTURING THE SAME

(71) Applicant: LG ELECTRONICS INC., Seoul (KR)

(72) Inventors: Younghyun Lee, Seoul (KR); Sangwook Park, Seoul (KR); Yoonsil Jin, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 62 days.

(21) Appl. No.: 13/671,262

(22) Filed: Nov. 7, 2012

(65) Prior Publication Data

US 2013/0319517 A1 Dec. 5, 2013

(30) Foreign Application Priority Data

Jun. 5, 2012 (KR) ........................ 10-2012-0060445

(51) Int. Cl.
*H01L 31/0224* (2006.01)
*H01L 31/18* (2006.01)
*H01L 31/068* (2012.01)

(52) U.S. Cl.
CPC .... *H01L 31/022433* (2013.01); *H01L 31/0224* (2013.01); *H01L 31/068* (2013.01); *H01L 31/1804* (2013.01); *Y02E 10/547* (2013.01)

(58) Field of Classification Search
CPC ........................................................ H01L 31/00
USPC .......................................................... 136/256
See application file for complete search history.

(56) References Cited

U.S. PATENT DOCUMENTS

| | | | | |
|---|---|---|---|---|
| 2009/0008787 | A1* | 1/2009 | Wenham et al. | 257/773 |
| 2009/0142875 | A1 | 6/2009 | Borden et al. | |
| 2010/0089447 | A1* | 4/2010 | Basol et al. | 136/256 |
| 2010/0319770 | A1* | 12/2010 | Lee et al. | 136/256 |
| 2011/0139243 | A1* | 6/2011 | Shim et al. | 136/259 |
| 2011/0146765 | A1 | 6/2011 | Ahn et al. | |
| 2011/0214727 | A1* | 9/2011 | Esturo-Breton et al. | 136/255 |
| 2012/0060917 | A1 | 3/2012 | Jin et al. | |

FOREIGN PATENT DOCUMENTS

| | | | |
|---|---|---|---|
| CN | 102142479 | A | 8/2011 |
| KR | 10-2011-0124532 | A | 11/2011 |
| KR | 10-1101621 | B1 | 1/2012 |

* cited by examiner

*Primary Examiner* — Tamir Ayad
*Assistant Examiner* — Bethany L Martin
(74) *Attorney, Agent, or Firm* — Birch, Stewart, Kolasch & Birch, LLP

(57) ABSTRACT

A solar cell includes a substrate, a selective emitter region which is positioned at the substrate and includes a lightly doped region and a heavily doped region, a first dielectric layer which is positioned on the selective emitter region and includes a plurality of first openings, which are separated from one another, and a plurality of second openings positioned around the plurality of first openings, a first electrode connected to the selective emitter region through the plurality of first openings and the plurality of second openings, and a second electrode which is positioned on the substrate and is connected to the substrate. The plurality of first openings and the plurality of second openings each have a different plane shape. The plane shape of the first opening has a line shape, and the plane shape of the second opening has a dot shape.

17 Claims, 9 Drawing Sheets

SOLAR CELL AND METHOD FOR MANUFACTURING THE SAME

This application claims priority to and the benefit of Korean Patent Application No. 10-2012-0060445 filed in the Korean Intellectual Property Office on Jun. 5, 2012, the entire contents of which are incorporated herein by reference.

BACKGROUND OF THE INVENTION

1. Field of the Invention

Embodiments of the invention relate to a solar cell and a method for manufacturing the same.

2. Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes a substrate and an emitter region, which are formed of semiconductors of different conductive types, for example, a p-type and an n-type, and thus, form a p-n junction, and electrodes respectively connected to the substrate and the emitter region.

When light is incident on the solar cell having the above-described structure, electrons inside the semiconductors become free electrons (hereinafter referred to as 'electrons') by the photoelectric effect. Further, electrons and holes respectively move to the n-type semiconductor (for example, the emitter region) and the p-type semiconductor (for example, the substrate) based on the principle of the p-n junction. The electrons moving to the emitter region and the holes moving to the substrate are collected by the electrode connected to the emitter region and the electrode connected to the substrate, respectively. The electrodes are connected to each other using electric wires to thereby obtain electric power.

SUMMARY OF THE INVENTION

In one aspect of the invention, there is a solar cell including a substrate, a selective emitter region positioned at the substrate, the selective emitter region including a lightly doped region and a heavily doped region, a first dielectric layer positioned on the selective emitter region, the first dielectric layer including a plurality of first openings, which are separated from one another, and a plurality of second openings positioned around the plurality of first openings, a first electrode connected to the selective emitter region through the plurality of first openings and the plurality of second openings, and a second electrode which is positioned on the substrate and is connected to the substrate, wherein the plurality of first openings and the plurality of second openings each have a different plane shape.

The plane shape of the plurality of first openings has a line shape, and the plane shape of the plurality of second openings has a dot shape.

The plurality of second openings are positioned on each of both sides of each first opening.

A width of the each first opening is about 8 μm to 12 μm. A maximum distance between the plurality of second openings positioned on each of both sides of the each first opening is about 10 μm to 25 μm.

The heavily doped region of the selective emitter region has the same plane shape as the plurality of first openings.

The first dielectric layer is positioned between the plurality of first openings and the plurality of second openings. The first electrode includes a seed layer positioned on the surface of the selective emitter region exposed through the first and second openings and a conductive metal layer positioned on the seed layer.

The seed layer contains nickel (Ni), and the conductive metal layer contains copper (Cu) and tin (Sn) or contains silver (Ag).

The first electrode may include a plurality of first finger electrodes positioned on a first surface of the substrate. Alternatively, the first electrode may include a plurality of first finger electrodes and a plurality of first bus bar electrodes formed in a direction crossing the plurality of first finger electrodes.

When the first electrode further includes the plurality of first bus bar electrodes, the first dielectric layer further includes at least one third opening and a plurality of fourth openings positioned around the third opening. In this instance, the plurality of first bus bar electrodes are connected to the selective emitter region through the third and fourth openings.

One third opening may be positioned under the at least one first bus bar electrode. Alternatively, at least two third openings may be positioned under one first bus bar electrode.

A remaining area of the first surface of the substrate excluding a formation area of the first and third openings may have a textured surface. The formation area of the first and third openings in the first surface of the substrate may have a substantially flat surface.

The first dielectric layer is positioned between the at least one third opening and the plurality of fourth openings.

As one example of the second electrode, the second electrode may include a plurality of second bus bar electrodes, which are positioned on a second surface opposite the first surface of the substrate at a location corresponding to the plurality of first bus bar electrodes, and a surface electrode, which is positioned between the second bus bar electrodes on the second surface of the substrate. The surface electrode may entirely cover the second surface between the second bus bar electrodes.

In this instance, the solar cell having the above-described configuration may produce an electric current using light incident on the first surface of the substrate.

As another example of the second electrode, the second electrode may include a plurality of second bus bar electrodes, which are positioned on a second surface opposite the first surface of the substrate at a location corresponding to the plurality of first bus bar electrodes, and a plurality of second finger electrodes which are positioned on the second surface of the substrate and are formed in a direction crossing the second bus bar electrodes.

In this instance, the solar cell having the above-described configuration may produce an electric current using light incident on the first and second surfaces of the substrate.

In another aspect of the invention, there is a method for manufacturing a solar cell including forming an impurity region of a second conductive type different from a first conductive type at a first surface of a semiconductor substrate of the first conductive type, forming a dielectric layer on the impurity region, forming an impurity layer of the second conductive type on the dielectric layer, irradiating a laser beam onto the impurity layer to form both a plurality of first openings, which are separated from one another, and a plurality of second openings positioned around the plurality of first openings in the dielectric layer and to inject impurities of the impurity layer into the impurity region exposed through the plurality of first openings to form a selective emitter region using the impurity region, and forming a seed layer and a conductive metal layer on the selective emitter region exposed through the plurality of first openings and the plurality of second openings using a plating method.

The method may further include, before forming the impurity region, texturing the first surface of the semiconductor substrate to form a textured surface.

A laser beam having the Gaussian distribution may be used to form the plurality of first openings and the plurality of second openings.

According to the above-described configuration, the plurality of second openings are positioned around the first opening, and the plurality of fourth openings are positioned around the third opening.

Accordingly, because the seed layer may be formed on the first surface of the substrate exposed through the second and fourth openings, a contact resistance between the electrode and the selective emitter region decreases, and a junction strength therebetween increases. Hence, the efficiency of the solar cell is improved.

Because the conductive metal layer positioned on the seed layer may be formed using copper, the manufacturing cost of the solar cell may be reduced. When the electrodes are formed using a direct plating method, a self align may be performed. Hence, the number of manufacturing processes may be reduced.

Because the selective emitter region and the openings are simultaneously formed using the laser beam, the width of the finger electrode may be reduced. Hence, an incident area of the solar cell may increase.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
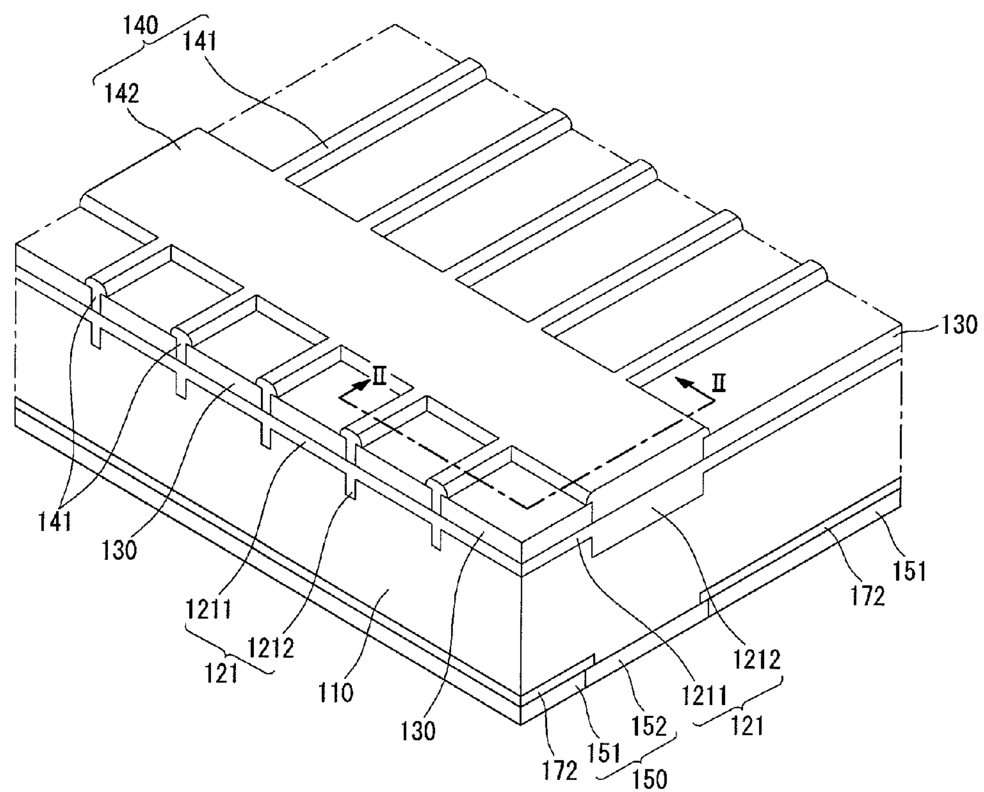
FIG. 1 is a partial perspective view of a solar cell according to a first embodiment of the invention.

Reference will now be made in detail to embodiments of the invention, examples of which are illustrated in the accompanying drawings. This invention may, however, be embodied in many different forms and should not be construed as limited to the embodiments set forth herein.

Wherever possible, the same reference numbers will be used throughout the drawings to refer to the same or like parts. A detailed description of known arts will be omitted if it is determined that the known arts can lead to obscuring of the embodiments of the invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present.

In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Example embodiments of the invention will be described with reference to FIGS. 1 to 9.

A solar cell according to an example embodiment of the invention is described in detail with reference to FIGS. 1 and 2.

Figure 2:
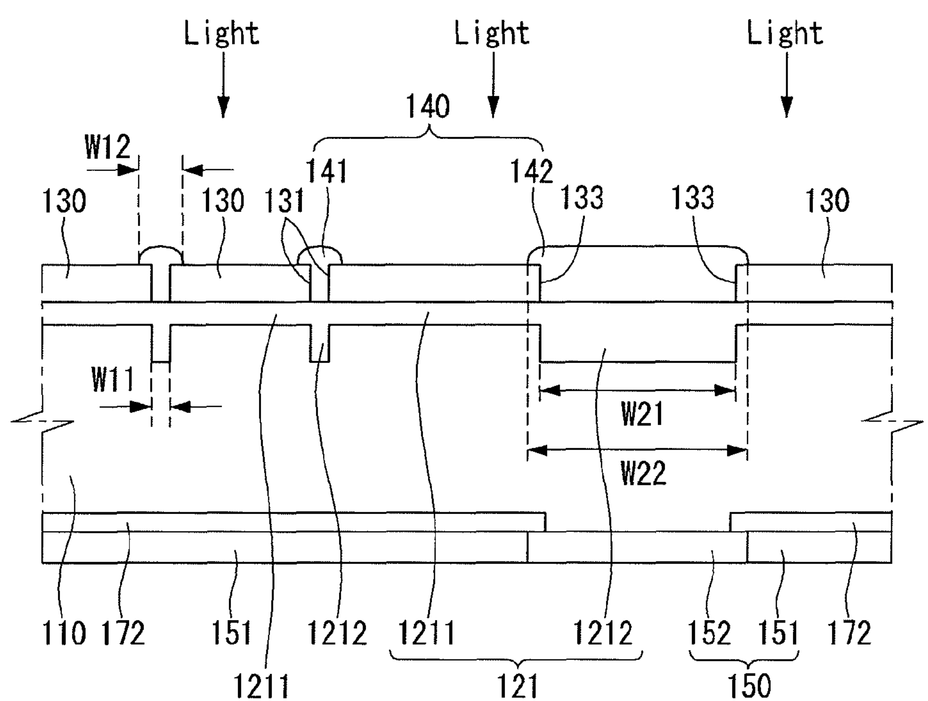
FIG. 2 is a cross-sectional view taken along line II-II of FIG. 1.

As shown in FIGS. 1 and 2, a solar cell according to a first embodiment of the invention includes a substrate 110, a selective emitter region 121 positioned at a front surface (or a first surface) of the substrate 110, on which light is incident, a first dielectric layer 130 positioned on the selective emitter region 121, a first electrode 140 which is positioned on the front surface of the substrate 110 and includes a plurality of first finger electrodes 141 and a plurality of first bus bar electrodes 142, a surface field region 172 positioned at a back surface (or a second surface) opposite the front surface of the substrate 110, and a second electrode 150 positioned on the surface field region 172 and the back surface of the substrate 110.

The substrate 110 is a semiconductor substrate formed of a semiconductor such as first conductive type silicon, for example, p-type silicon, though not required. The semiconductor used in the substrate 110 is a crystalline semiconductor, such as single crystal silicon and polycrystalline silicon.

When the substrate 110 is of a p-type, the substrate 110 is doped with impurities of a group III element such as boron (B), gallium (Ga), and indium (In). Alternatively, the substrate 110 may be of an n-type and/or may be formed of a semiconductor material other than silicon.

If the substrate 110 is of the n-type, the substrate 110 may be doped with impurities of a group V element such as phosphorus (P), arsenic (As), and antimony (Sb).

The entire surface of the substrate 110 may be textured to form a textured surface corresponding to an uneven surface having a plurality of protrusions and a plurality of depressions or having uneven characteristics. In this instance, a surface area of the substrate 110 may increase because of the textured surface of the substrate 110, and thus, an incidence area of light may increase. Further, because an amount of light reflected by the substrate 110 may decrease, an amount of light incident on the substrate 110 may increase.

The selective emitter region 121 is an impurity doped region doped with impurities of a second conductive type (for example, n-type) opposite the first conductive type (for example, p-type) of the substrate 110. The selective emitter region 121 is positioned at the front surface of the substrate 110. Thus, the selective emitter region 121 of the second conductive type forms a p-n junction along with a first conductive type region of the substrate 110.

The selective emitter region 121 includes a lightly doped region 1211 and a heavily doped region 1212 each having a different impurity doping thickness and a different sheet resistance.

In the embodiment of the invention, an impurity doping thickness of the lightly doped region 1211 is less than an impurity doping thickness of the heavily doped region 1212. Thus, an impurity doping concentration of the lightly doped region 1211 is lower than an impurity doping concentration of the heavily doped region 1212.

Further, a sheet resistance of the lightly doped region 1211 is greater than a sheet resistance of the heavily doped region 1212. For example, the sheet resistance of the lightly doped region 1211 may be about 80 Ω/sq. to 120 Ω/sq., and the sheet resistance of the heavily doped region 1212 may be about 10 Ω/sq. to 50 Ω/sq.

A p-n junction surface (hereinafter, referred to as "a first junction surface") between the lightly doped region 1211 and the substrate 110 (i.e., the first conductive type region of the substrate 110) and a p-n junction surface (hereinafter, referred to as "a second junction surface") between the heavily doped region 1212 and the substrate 110 are positioned at different height levels. Thus, a thickness between the back surface of the substrate 110 and the first junction surface is greater than a thickness between the back surface of the substrate 110 and the second junction surface.

As shown in FIGS. 1 and 2, the lightly doped region 1211 is positioned under the first dielectric layer 130, and the heavily doped region 1212 is positioned under the first finger electrodes 141 and the first bus bar electrodes 142.

The heavily doped region 1212 underlying each first finger electrode 141 extends along the first finger electrode 141 in the same direction as the first finger electrode 141. Further, the heavily doped region 1212 underlying each first bus bar electrode 142 extends along the first bus bar electrode 142 in the same direction as the first bus bar electrode 142.

Accordingly, the plane of the heavily doped region 1212 has a lattice shape. In the embodiment of the invention, a 'plane shape' indicates a shape when viewing the first surface of the substrate 110 at the top of the first surface of the substrate 110.

Because an extension direction of the first finger electrodes 141 and an extension direction of the first bus bar electrodes 142 cross each other, the first finger electrodes 141 and the first bus bar electrodes 142 are connected to each other at crossings of the first finger electrodes 141 and the first bus bar electrodes 142.

Thus, the heavily doped region 1212 underlying the first finger electrodes 141 and the heavily doped region 1212 underlying the first bus bar electrodes 142 are connected to each other in a connection portion of the first finger electrodes 141 and the first bus bar electrodes 142.

Regarding carriers, for example, electrons and holes produced by light incident on the substrate 110, the electrons and the holes respectively move to the n-type semiconductor and the p-type semiconductor by a built-in potential difference resulting from the p-n junction between the substrate 110 and the selective emitter region 121.

Thus, when the substrate 110 is of the p-type and the selective emitter region 121 is of the n-type, the electrons move to the selective emitter region 121, and the holes move to the back surface of the substrate 110.

Because the selective emitter region 121 forms the p-n junction along with the substrate 110, the selective emitter region 121 may be of the p-type when the substrate 110 is of the n-type unlike the embodiment described above. In this instance, the electrons move to the back surface of the substrate 110, and the holes move to the selective emitter region 121.

Returning to the embodiment of the invention, when the selective emitter region 121 is of the n-type, the selective emitter region 121 may be doped with impurities of a group V element such as P, As, and Sb. On the contrary, when the selective emitter region 121 is of the p-type, the selective emitter region 121 may be doped with impurities of a group III element such as B, Ga, and In.

It is preferable, but not required, that the sheet resistance of the lightly doped region 1211 is about 80 Ω/sq. to 120 Ω/sq., so as to reduce an amount of light absorbed in the lightly doped region 1211, to increase an amount of light incident on the substrate 110, and to reduce an amount of carriers lost by impurities.

It is preferable, but not required, that the sheet resistance of the heavily doped region 1212 is about 10 Ω/sq. to 50 Ω/sq., so as to reduce a contact resistance between the heavily doped region 1212 and the first electrode 140 and to reduce an amount of carriers lost by the contact resistance while the carriers are in movement.

As described above, because the lightly doped region 1211 of the selective emitter region 121 is positioned under the first dielectric layer 130, the first dielectric layer 130 is positioned on the lightly doped region 1211.

The first dielectric layer 130 may be formed of hydrogenated silicon nitride (SiNx:H), hydrogenated silicon oxide (SiOx:H), hydrogenated silicon oxynitride (SiOxNy:H), or aluminum oxide (AlxOy), etc.

The first dielectric layer 130 reduces a reflectance of light incident on the solar cell and increases selectivity of a predetermined wavelength band, thereby increasing the efficiency of the solar cell.

The first dielectric layer 130 performs a passivation function, which converts a defect, for example, dangling bonds existing at and around the surface of the substrate 110 into stable bonds using hydrogen (H) or oxygen ($O_2$) contained in the first dielectric layer 130 to thereby prevent or reduce a recombination and/or a disappearance of carriers moving to the surface of the substrate 110.

The first dielectric layer 130 reduces an amount of carriers lost by the defect at and around the surface of the substrate 110 to thereby improve the efficiency of the solar cell.

In the embodiment of the invention, the first dielectric layer 130 has a single-layered structure, but in other embodiments of the invention, the first dielectric layer 130 may have a multi-layered structure, for example, a double-layered structure. The first dielectric layer 130 may be omitted, if desired.

The first electrode 140 including the plurality of first finger electrodes 141 and the plurality of first bus bar electrodes 142 is positioned on the selective emitter region 121 and the first dielectric layer 130, and also is connected to the heavily doped region 1212 of the selective emitter region 121.

The plurality of first finger electrodes 141 are separated from one another and extend parallel to one another in a fixed direction. Each of the first finger electrodes 141 is electrically and physically connected to the heavily doped region 1212.

The first dielectric layer 130 includes a plurality of first openings 131 for connecting each of the first finger electrodes 141 to the heavily doped region 1212 and a plurality of third openings 133 for connecting each of the first bus bar electrodes 142 to the heavily doped region 1212.

The first dielectric layer 130 further includes a plurality of second openings 132 positioned around the first openings 131 and a plurality of fourth openings 134 positioned around the third openings 133.

Figure 4:
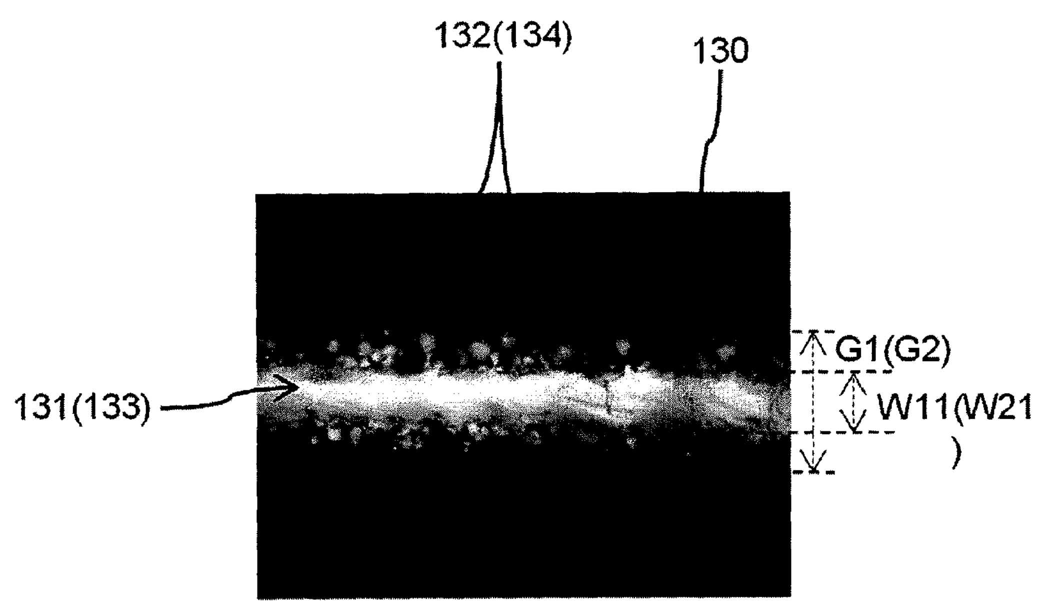
FIG. 4 shows a first opening shown in FIG. 3B.
Figure 5:
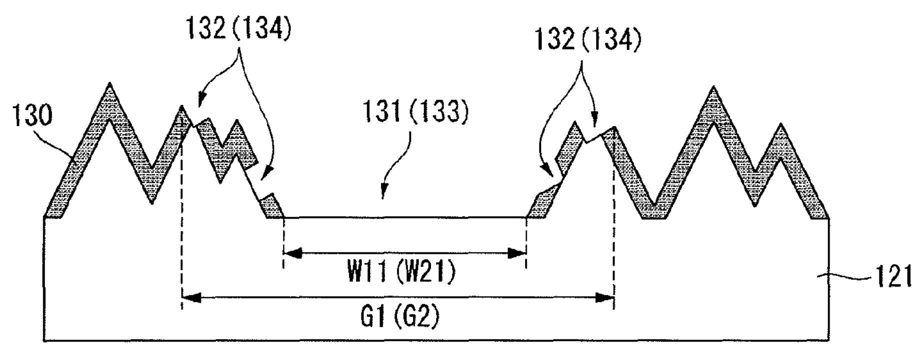
FIG. 5 is an enlarged cross-sectional view of a first opening shown in FIG. 3B.

The first to fourth openings 131 to 134 are described below with reference to FIGS. 4 and 5.

The first and second openings 131 and 132 are formed using a laser beam having the normal (or Gaussian) distribution. The second openings 132 are formed around the first openings 131 when forming the first openings 131.

The first opening 131 has the same plane shape (for example, the line shape) as the first finger electrode 141, so as to bring the first finger electrode 141 into contact with the heavily doped region 1212 of the selective emitter region 121.

On the other hand, the plane shape of the second opening 132 has a dot shape. The plurality of second openings 132 are formed around each of both sides of the first opening 131. Thus, the first dielectric layer 130 is formed between the first and second openings 131 and 132.

The first openings 131 are formed using a center laser beam (or a center portion of a laser beam), of which an output is equal to or greater than a predetermined level among laser beams having the Gaussian distribution. A first surface of the substrate 110 or the surface of the selective emitter region 121 exposed by the first openings 131 is substantially flat.

In the embodiment of the invention, the "substantially flat" indicates that there is no uneven portion similar to the uneven portions of the textured surface on a surface. Thus, uneven portions similar to the uneven portions of the textured surface are not positioned on the surface of the heavily doped region 1212 exposed by each first opening 131.

On the other hand, the second openings 132 are non-uniformly formed using a peripheral laser beam, of which an output is low among the laser beams having the Gaussian distribution. The plurality of second openings 132 are non-uniformly formed around both sides of the first opening 131.

In other words, the plurality of second openings 132 are locally formed in a portion of the textured surface positioned around the first opening 131.

The third openings 133 may be formed using the same method as the first openings 131, and the fourth openings 134 may be formed using the same method as the second openings 132.

Accordingly, uneven portions similar to the uneven portions of the textured surface are not positioned on the surface of the heavily doped region 1212 exposed by the third opening 133 in the same manner as the first opening 131. The first dielectric layer 130 is formed between the third and fourth openings 133 and 134.

In the embodiment of the invention, a width W11 of the first opening 131 may be about 8 μm to 12 μm. Further, a maximum distance G1 between the second openings 132 positioned on both sides of the first opening 131 may be about 10 μm to 25 μm.

A width W21 of the third opening 133 is less than a width W22 of the first bus bar electrode 142. A maximum distance G2 between the fourth openings 134 positioned on both sides of the third opening 133 is greater than the width W21 of the third opening 133.

A width of the heavily doped region 1212 underlying the first finger electrodes 141 is substantially equal to the width W11 of the first opening 131.

Each first finger electrode 141 is positioned on the heavily doped region 1212, and also a portion of the first finger electrode 141 is positioned on the first dielectric layer 130 adjacent to the first finger electrode 141. Accordingly, as shown in FIGS. 1 and 2, a width W12 of the first finger electrode 141 is greater than the width of the heavily doped region 1212 underlying the first finger electrodes 141.

For example, the width W12 of the first finger electrode 141 may be about 20 μm to 40 μm, and the width (substantially equal to the width W11 of the first opening 131) of the heavily doped region 1212 underlying the first finger electrodes 141 may be about 10 μm to 20 μm.

The first finger electrodes 141 are electrically and physically connected to the heavily doped region 1212 of the selective emitter region 121. The first finger electrodes 141 collect carriers (for example, electrons) moving to the selective emitter region 121.

The plurality of first bus bar electrodes 142 are separated from one another and extend parallel to one another in a direction crossing the first finger electrodes 141. The first bus bar electrodes 142 are electrically and physically connected to the heavily doped region 1212 exposed through the third openings 133.

A width W22 of the first bus bar electrode 142 is greater than the width (substantially equal to the width W21 of the third opening 133) of the heavily doped region 1212 underlying the first bus bar electrodes 142 in the same manner as the first finger electrode 141. For example, the width W22 of the first bus bar electrode 142 may be about 1 mm to 1.5 mm.

The first bus bar electrodes 142 are positioned on the same level layer as the first finger electrodes 141 and are electrically and physically connected to the first finger electrodes 141 at the crossings of the first finger electrodes 141 and the first bus bar electrodes 142.

Accordingly, as shown in FIG. 1, the plurality of finger electrodes 141 have a stripe shape extending in a fixed direction (or a first direction), for example, a transverse or longitudinal direction, and the plurality of first bus bar electrodes 142 have a stripe shape extending in a direction (or a second direction), for example, a longitudinal or transverse direction crossing the first finger electrodes 141. Hence, the first electrode 140 has a lattice shape on the front surface of the substrate 110.

The heavily doped region 1212 of the selective emitter region 121 has a lattice shape in the same manner as the first electrode 140.

Alternatively, the heavily doped region 1212 of the selective emitter region 121 may be formed only under the first finger electrodes 141. The plurality of first bus bar electrodes 142 may be omitted, if desired or necessary.

The first bus bar electrodes 142 collect carriers collected by the first finger electrodes 141 as well as carriers moving from the heavily doped region 1212 and then transfer the collected carriers in a corresponding direction.

The first bus bar electrodes 142 have to collect carriers collected by the first finger electrodes 141 and have to move the collected carriers in a desired direction. Thus, the width W22 of each first bus bar electrode 142 may be greater than the width W12 of each finger electrode 141.

A conductive tape, for example, a ribbon is attached to the plurality of first bus bar electrodes 142, so as to connect the plurality of solar cells in series or parallel to one another. The plurality of first bus bar electrodes 142 of one solar cell are connected to a plurality of second bus bar electrodes of another solar cell adjacent to the one solar cell through the conductive tape.

In the embodiment of the invention, the first electrode 140 is formed using a plating method, in particular, a direct plating method capable of performing a self-alignment. For this, the plurality of first to fourth openings 131 to 134 are formed in the first dielectric layer 130, and then a plating process is performed on the selective emitter region 121 exposed through the first to fourth openings 131 to 134.

A growth of the plating is carried out in the horizontal direction as well as the vertical direction. The plating growth in the vertical direction and the horizontal direction is an isotropic growth having the almost equal thickness.

Figure 6:
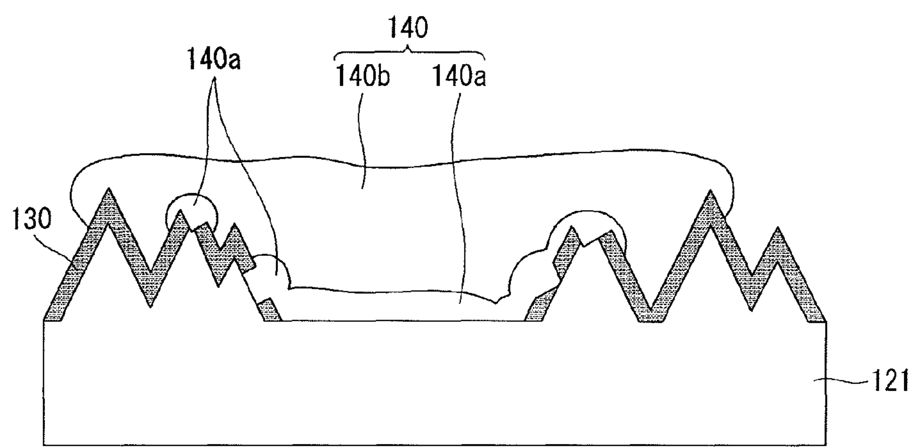
FIG. 6 is an enlarged cross-sectional view of a first finger electrode shown in FIG. 3C.

As shown in FIG. 6, a seed layer 140*a* is formed on not only the surface of the selective emitter region 121 exposed through the first and third openings 131 and 133, but also the surface of the selective emitter region 121 exposed through the second and fourth openings 132 and 134.

Hence, a plating area of the seed layer 140*a* increases because the seed layer 140*a* is formed on the surface of the selective emitter region 121 exposed through the second and fourth openings 132 and 134. As a result, a plating area of a conductive metal layer 140*b*, for example, a copper or silver layer formed on the seed layer 140*a* increases.

As described above, when the plating area of the seed layer 140*a* increases, a contact area between the first electrode 140 and the heavily doped region 1212 increases. Hence, the contact resistance between the heavily doped region 1212 and the first electrode 140 is reduced, and a junction strength therebetween is improved.

As described above, each first finger electrode 141 and each first bus bar electrode 142 of the first electrode 140 are positioned on not only the heavily doped region 1212 of the selective emitter region 121 exposed through the first and third openings 131 and 133 but also the first dielectric layer 130 positioned around the first and third openings 131 and 133. Further, because thicknesses of the plating growth in the horizontal direction and the vertical direction are almost equal to each other, a plating growth portion of the heavily doped region 1212 has a shape of a curved surface.

Because the first electrode 140 is formed through the plating method, a density of the first electrode 140 formed through the plating method is much greater than a density of a first electrode formed through a screen printing method using a silver paste, etc. Hence, the conductivity of the first electrode 140 is greatly improved.

When the conductive metal layer 140*b* of the first electrode 140 is formed of copper, a tin (Sn) layer may be plated on the copper layer 140*b*, so that the conductive tape is attached to the copper layer 140*b*.

When the conductive metal layer 140*b* of the first electrode 140 has a single-layered structure formed of silver (Ag), a specific resistance of the first electrode 140 may be about 1.6 uΩcm to 2.5 uΩcm and is much less than a specific resistance (about 6.7 uΩcm) of the first electrode formed through the screen printing method using the Ag paste.

When the seed layer 140*a* is formed of nickel (Ni), nickel silicide exists between the seed layer 140*a* and the selective emitter region 121 due to the coupling between nickel (Ni) and the material (i.e., silicon of a second conductive type region of the substrate 110) for forming the selective emitter region 121.

FIG. 1 shows an example of the number of first finger electrodes 141, the number of first bus bar electrodes 142, and the number of heavily doped regions 1212 in the substrate 110. The numbers may vary, if desired or necessary.

The surface field region 172 positioned at the back surface of the substrate 110 is a region (for example, a $p^+$-type region) which is more heavily doped than the substrate 110 with impurities of the same conductive type as the substrate 110.

A potential barrier is formed by a difference between impurity doping concentrations of the first conductive type region of the substrate 110 and the surface field region 172. Hence, the potential barrier prevents or reduces electrons from moving to the surface field region 172 used as a moving path of holes and makes it easier for holes to move to the surface field region 172.

Thus, the surface field region 172 reduces an amount of carriers lost by a recombination and/or a disappearance of electrons and holes at and around the back surface of the substrate 110 and accelerates a movement of desired carriers (for example, holes), thereby increasing the movement of carriers to the second electrode 150.

The second electrode 150 includes a surface electrode 151 and a plurality of second bus bar electrodes 152 connected to the surface electrode 151.

The surface electrode 151 contacts the surface field region 172 positioned at the back surface of the substrate 110 and is substantially positioned on the entire back surface of the substrate 110 except an edge of the back surface of the substrate 110 and a formation area of the second bus bar electrodes 152. Thus, the back surface of the substrate 110 between the second bus bar electrodes 152 is covered by the surface electrode 151.

The surface electrode 151 contains a conductive material, for example, aluminum (Al) or silver (Ag).

The surface electrode 151 collects carriers (for example, holes) moving to the surface field region 172.

Because the surface electrode 151 contacts the surface field region 172 having the impurity doping concentration higher than the substrate 110, a contact resistance between the substrate 110 (i.e., the surface field region 172) and the surface electrode 151 decreases. Hence, the transfer efficiency of carriers from the substrate 110 to the surface electrode 151 is improved.

The plurality of second bus bar electrodes 152 are positioned on the back surface of the substrate 110, on which the surface electrode 151 is not positioned, and are connected to the surface electrode 151.

Further, the second bus bar electrodes 152 are positioned opposite the first bus bar electrodes 142 at a location corresponding to the first bus bar electrodes 142 with the substrate 110 interposed therebetween.

The second bus bar electrodes 152 collect carriers transferred from the surface electrode 151, similar to the first bus bar electrodes 142.

The conductive film is positioned on the second bus bar electrodes 152 in the same manner as the first bus bar electrodes 142. Hence, the second bus bar electrodes 152 of one solar cell are connected to the first bus bar electrodes 142 of another solar cell adjacent to the one solar cell through the conductive film.

The second bus bar electrodes 152 may be formed of a material having better conductivity than the surface electrode 151. The second bus bar electrodes 152 may contain at least one conductive material, for example, silver (Ag). Thus, the surface electrode 151 and the second bus bar electrodes 152 may be formed of different materials.

An operation of the solar cell having the above-described structure is described below.

When light irradiated to the solar cell is incident on the substrate 110 through the first dielectric layer 130, electrons and holes are generated in the semiconductor part by light energy produced based on the incident light. In this instance, because a reflection loss of the light incident on the substrate 110 is reduced by the first dielectric layer 130, an amount of light incident on the substrate 110 increases.

The electrons move to the n-type selective emitter region 121 and the holes move to the p-type substrate 110 due to the p-n junction of the substrate 110 and the selective emitter region 121.

The electrons moving to the selective emitter region 121 sequentially move to the lightly doped region 1211 and the heavily doped region 1212, are collected by the first finger electrodes 141 and the first bus bar electrodes 142, and move along the first bus bar electrodes 142. The holes moving to the substrate 110 are collected by the surface electrode 151 and the second bus bar electrodes 152 and move along the second bus bar electrodes 152.

When the first bus bar electrodes 142 of one solar cell are connected to the second bus bar electrodes 152 of another solar cell adjacent to the one solar cell using the conductive tape, current flows therein to thereby enable use of the current for electric power.

A method for manufacturing a solar cell according to an example embodiment of the invention is described below with reference to FIGS. 3A to 3D.

Figure 3A:
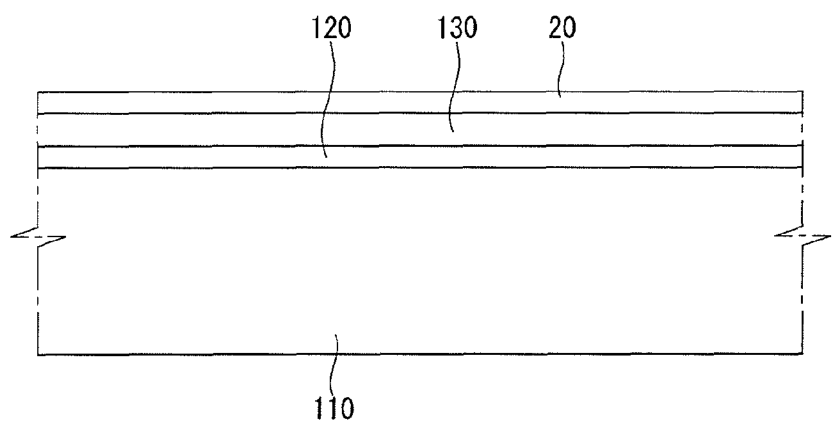
FIGS. 3A to 3D sequentially illustrate a method for manufacturing the solar cell according to the first embodiment of the invention.

As shown in FIG. 3A, an impurity region 120 containing impurities (for example, phosphorus (P)) of a second conductive type (for example, n-type) is formed at a front surface of a substrate 110 of a first conductive type (for example, p-type), which is formed of single crystal silicon or polycrystalline silicon.

The impurity region 120 may be formed using an ion implantation method or a thermal diffusion method and may form a p-n junction along with a first conductive type region of the substrate 110. A sheet resistance of the impurity region 120 may be about 80 Ω/sq. to 120 Ω/sq.

As described above, because the impurities of the second conductive type are injected into the substrate 110 to form the impurity region 120, the impurity region 120 is formed of the same material (i.e., crystalline semiconductor such as single crystal silicon and polycrystalline silicon) as the substrate 110. Hence, the substrate 110 and the impurity region 120 form a homojunction.

In an alternative example, before forming the impurity region 120 or after forming the impurity region 120, a dry etching method such as a reaction ion etching method or a wet etching method may be performed on the flat front surface (or the surface of the impurity region 120) of the substrate 110 or the flat front surface and a flat back surface of the substrate 110 to form a textured surface corresponding to an uneven surface having a plurality of protrusions and a plurality of depressions or having uneven characteristics on the front surface of the substrate 110 or the front surface and the back surface of the substrate 110.

As described above, when the surface of the substrate 110 has the textured surface, an anti-reflection effect of light incident on the substrate 110 is improved, and an amount of light incident on the substrate 110 increases.

Next, a first dielectric layer 130 is formed on the impurity region 120 formed at the front surface of the substrate 110 using a deposition method such as a plasma enhanced chemical vapor deposition (PECVD) method. The first dielectric layer 130 may be formed of hydrogenated silicon nitride (SiNx:H), hydrogenated silicon oxide (SiOx:H), hydrogenated silicon oxynitride (SiOxNy:H), or aluminum oxide (AlxOy), etc.

Next, an impurity layer 20 containing impurities of the second conductive type is formed on the first dielectric layer 130 using an inkjet printing method, a spin coating method, or a screen printing method, etc.

Figure 3B:
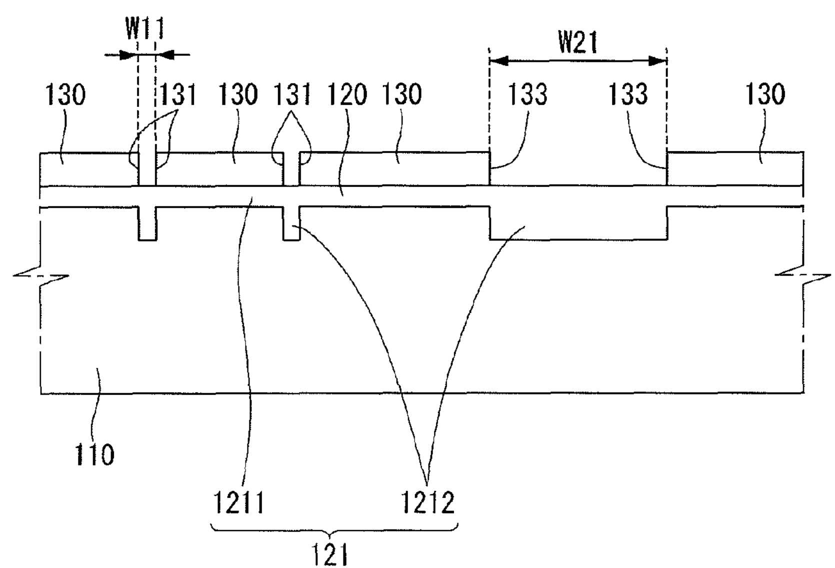

Next, as shown in FIG. 3B, a laser beam is locally irradiated onto the first dielectric layer 130 to form a plurality of first to fourth openings 131 to 134 exposing the impurity region 120 in the first dielectric layer 130.

The plurality of first and second openings 131 and 132 are first finger electrode openings for forming a plurality of first finger electrodes 141, and the plurality of third and fourth openings 133 and 134 are first bus bar electrode openings for forming a plurality of first bus bar electrodes 142.

When the laser beam is irradiated onto the impurity layer 20 to form the plurality of first to fourth openings 131 to 134 expose the impurity region 120 in the first dielectric layer 130, the impurities of the second conductive type contained in the impurity layer 20 positioned on the first dielectric layer 130 are additionally injected into a portion of the impurity region 120 exposed through the first to fourth openings 131 to 134, and thus, are locally doped on the impurity region 120.

Accordingly, the irradiation of the laser beam is to form the plurality of first to fourth openings 131 to 134 at a desired location of the first dielectric layer 130 by removing a desired portion of the first dielectric layer 130 and to additionally dope a desired portion of the impurity region 120 with the impurities of the second conductive type.

A portion of the impurity region 120 (exposed through the plurality of first to fourth openings 131 to 134), onto which the laser beam is irradiated, has an impurity doping concentration higher than other portion of the impurity region 120, onto which the laser beam is not irradiated, and thus, has a sheet resistance less than an initial sheet resistance of the impurity region 120.

For example, the portion of the impurity region 120 exposed through the plurality of first to fourth openings 131 to 134 has the sheet resistance of about 10 Ω/sq. to 50 Ω/sq., which is less than the initial sheet resistance (for example, about 80 Ω/sq. to 120 Ω/sq.) of the impurity region 120.

After the irradiation of the laser beam is completed, the impurity region 120 becomes a selective emitter region 121 including a lightly doped region 1211, which is positioned under the first dielectric layer 130 and has a sheet resistance of about 80 Ω/sq. to 120 Ω/sq., and a heavily doped region 1212, which is positioned in the portion of the impurity region 120 exposed through the plurality of first to fourth openings 131 to 134 and has a sheet resistance of about 10 Ω/sq. to 50 Ω/sq.

Accordingly, a width W11 of the first opening 131 may be substantially equal to a width of the heavily doped region 1212 underlying the first finger electrode 141. A width W21 of the third opening 133 may be substantially equal to a width of the heavily doped region 1212 underlying the first bus bar electrode 142.

The heavily doped region 1212 may be formed only in formation areas of the first and third openings 131 and 133. Alternatively, the heavily doped region 1212 may be formed in all of formation areas of the first to fourth openings 131 to 134.

Afterwards, the impurity layer 20 remaining on the first dielectric layer 130 is removed using hydrofluoric acid (HF) or pure water.

As described above, the plurality of first to fourth openings 131 to 134 of the first dielectric layer 130 are used to contact the heavily doped region 1212 of the selective emitter region 121 to the first finger electrodes 141 and the first bus bar electrodes 142 when the first finger electrodes 141 and the first bus bar electrodes 142 are formed using the plating method.

A first electrode including a plurality of first finger electrodes and a plurality of first bus bar electrodes is generally manufactured by applying a silver (Ag) paste containing silver (Ag) in a pattern determined based on a shape of the first electrode using a screen printing method and performing a thermal process.

A specific resistance of each of the first bus bar electrodes manufactured using the Ag paste is about 6.7 uΩcm, and a cross-sectional area of one first bus bar electrode may be about 37,500 $\mu m^2$ (=1,500 μm wide×25 μm thick). Further, a contact resistance of each first bus bar electrode manufactured using the Ag paste is about 3 uΩcm.

As described above, the width and the thickness of each first bus bar electrode manufactured using the Ag paste are about 1,500 μm (1.5 mm) and about 25 μm, respectively.

The first electrode may be manufactured using the plating method, so as to increase the incidence area of the solar cell by reducing the widths of the first finger electrode and the first bus bar electrode while maintaining the same operational characteristics as the first finger electrodes and the first bus bar electrodes manufactured using the screen printing method. In this instance, the widths of the first finger electrode and the first bus bar electrode manufactured using the plating method may be reduced.

Accordingly, the first electrode 140 of the solar cell according to the embodiment of the invention is manufactured using a plating method, in particular, a direct plating method.

When the first electrode 140 is manufactured using the plating method, the first dielectric layer 130 positioned on the selective emitter region 121 is partially or locally removed to form the plurality of first to fourth openings 131 to 134, so that the first electrode 140 contacts the heavily doped region 1212.

When the plating process is performed on the selective emitter region 121 exposed through the plurality of first to fourth openings 131 to 134, the plating process is performed in both the vertical and horizontal directions of the heavily doped region 1212. The plating growth of the heavily doped region 1212 is an isotropic growth, in which the plating thickness of the heavily doped region 1212 is almost uniform in the vertical and horizontal directions.

Thus, the plated metal material (for example, silver) is completely filled in the first to fourth openings 131 to 134 and is grown up to the height of the upper surface (i.e., the contact surface between the first dielectric layer 130 and the first electrode 140) of the first dielectric layer 130 adjacent to the first to fourth openings 131 to 134. Afterwards, the plating process is performed above the upper surface of the first dielectric layer 130 in the horizontal direction, and thus, is performed on the first dielectric layer 130 adjacent to the first to fourth openings 131 to 134 beyond the width of the first to fourth openings 131 to 134.

When the plated metal is silver (Ag), a specific resistance of the first electrode 140 is about 2.2 uΩcm and corresponds to about ⅓ of a specific resistance (about 6.7 uΩcm) of the first electrode manufactured using the Ag paste. Further, a contact resistance of the first electrode 140 plated with silver (Ag) is about 1 mΩcm and corresponds to about ⅓ of a contact resistance (about 3 uΩcm) of the first electrode manufactured using the Ag paste.

As described above, the specific resistance and the contact resistance of the first electrode 140 manufactured using the plating method correspond to about ⅓ of the specific resistance and the contact resistance of the first electrode manufactured using the Ag paste. Therefore, when the first electrode 140 manufactured using the plating method and the first electrode manufactured using the Ag paste have the same cross-sectional area, the operational characteristics (for example, the contact characteristic and the conductivity) of the first electrode 140 manufactured using the plating method may be about three times better than the operational characteristics of the first electrode manufactured using the Ag paste.

Instead of removing the first dielectric layer 130 using an etching paste or a separate mask, the laser beam is irradiated onto the first dielectric layer 130 to remove a desired portion of the first dielectric layer 130. Thus, the widths of the first and third openings 131 and 133 formed using the laser beam are much less than widths of the first and third openings 131 and 133 formed using the etching paste or the separate mask. Hence, the formation area of the heavily doped region 1212 decreases, and the formation width of the first electrode 140 decreases. As a result, the formation area of the first electrode 140 decreases.

In the embodiment of the invention, the laser beam used to form the plurality of openings 131 to 134 may have the Gaussian distribution and may have a wavelength of about 532 nm and power of about 5 W to 20 W. The power or irradiation time of the laser beam may be determined depending on the material or the thickness of the first dielectric layer 130.

Figure 3C:
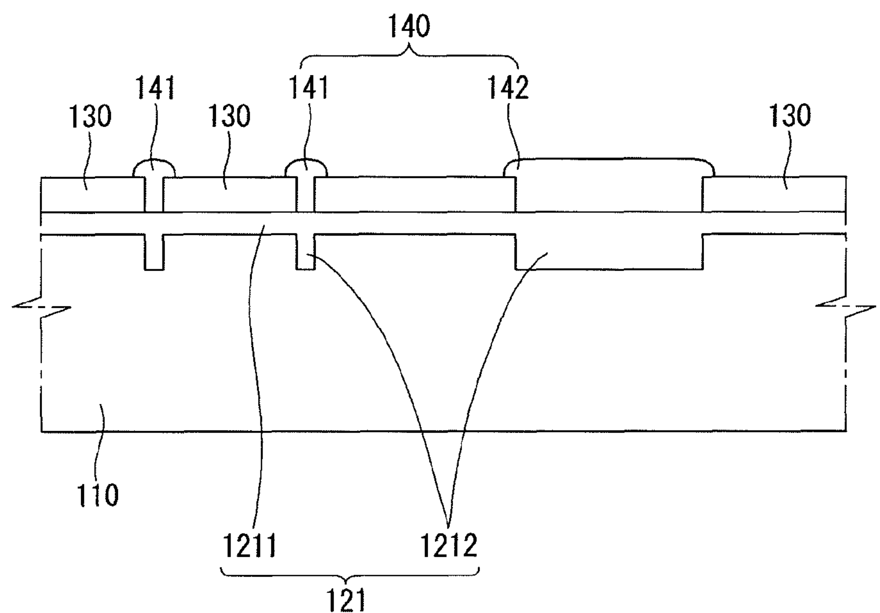

As shown in FIG. 3C, when the plurality of first and third openings 131 and 133 are formed in the first dielectric layer 130 so as to form the first electrode 140 using the plating method, the plating process is performed on the heavily doped region 1212 exposed through the plurality of openings 131 to 134 to form the first electrode 140 including the first finger electrodes 141 and the first bus bar electrodes 142.

More specifically, the plating process is performed on the heavily doped region 1212 exposed through the plurality of openings 131 to 134 by depositing the substrate 110 into a solution (for example, potassium dicyanoargentate ($KAg(CN)_2$)) containing corresponding metal ions (for example, Ag ions).

As described above, the plating growth of the metal for forming the first electrode 140 is the isotropic growth performed at the same speed in the vertical and horizontal directions. When the first finger electrodes 141 and the first bus bar electrodes 142 plating-grown inside the plurality of openings 131 to 134 are grown up to the height of the upper surface of the first dielectric layer 130, the first finger electrodes 141 and the first bus bar electrodes 142 are formed on the first dielectric layer 130 adjacent to the plurality of openings 131 to 134 because the metal plating growth is carried out in the horizontal direction as well as the vertical direction.

In the embodiment of the invention, the first electrode 140 formed using the plating method has a single-layered structure formed of metal such as silver (Ag). Alternatively, the first electrode 140 may have a multi-layered structure, for example, a double-layered structure and a triple-layered structure.

When the first electrode 140 has the single-layered structure formed of silver (Ag), a specific resistance of the first electrode 140 may be about 1.6 uΩcm to 2.5 uΩcm. Because the first electrode 140 is formed using the plating method, a density of the first electrode 140 formed using the plating method is much greater than a density of the first electrode formed through the screen printing method using the silver paste. Thus, the specific resistance of the first electrode 140 formed using the plating method is much less than the specific resistance (about 6.7 uΩcm) of the first electrode formed using the silver paste. Hence, the conductivity of the first electrode 140 is greatly improved.

Alternatively, when the first electrode 140 has the double-layered structure, a lower layer of the first electrode 140 contacting the selective emitter region 121 may be formed of nickel (Ni) and an upper layer positioned on the lower layer may be formed of silver (Ag).

Alternatively, when the first electrode 140 has the triple-layered structure, a lower layer of the first electrode 140 contacting the selective emitter region 121 may be formed of nickel (Ni), a middle layer positioned on the lower layer may be formed of copper (Cu), and an upper layer positioned on the middle layer may be formed of silver (Ag) or tin (Sn).

In this instance, the lower layer of the first electrode 140 is to improve adhesive characteristics by reducing a contact resistance between the lower layer and the heavily doped region 1212 contacting the lower layer. The middle layer of the first electrode 140 is to reduce the cost, and thus, may be formed of a cheap material with the good conductivity, for example, copper (Cu).

When the middle layer is formed of copper (Cu), the lower layer underlying the middle layer prevents copper (Cu), which may easily and stably couple with silicon (Si), from being penetrated (or absorbed) in the heavily doped region 1212 formed of silicon (Si). Namely, the lower layer prevents copper (Cu) from serving as impurities blocking the movement of carriers.

Further, the upper layer is to prevent the oxidation of the lower layer or the middle layer underlying the upper layer and to improve an adhesive strength between the conductive tape positioned on the upper layer and the first electrode.

As described above, when the first electrode 140 has the multi-layered structure, the plurality of layers of the first electrode 140 are sequentially formed using the plating method with a desired thickness.

Figure 3D:
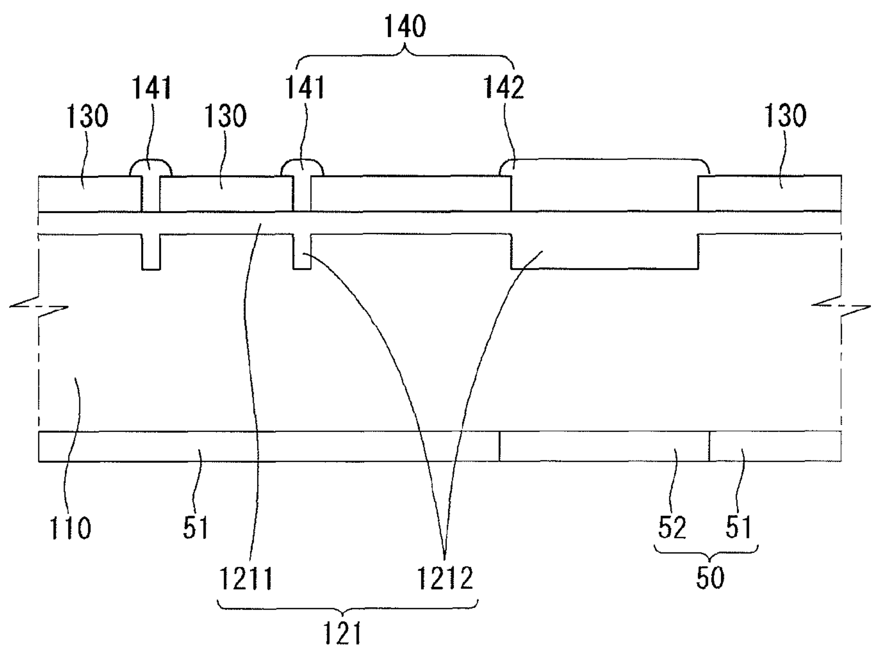

Next, as shown in FIG. 3D, the silver-containing paste is printed using the screen printing method and then is dried to locally form a second bus bar electrode pattern 52 on the back surface of the substrate 110 at a location corresponding to the first bus bar electrode 142. Further, aluminum (Al), Al—Ag, or the silver-containing paste is printed on the back surface of the substrate 110, on which the second bus bar electrode pattern 52 is not formed, using the screen printing method and then is dried to locally form a surface electrode pattern 51 on the back surface of the substrate 110. Hence, a second electrode pattern 50 including the surface electrode pattern 51 and the second bus bar electrode pattern 52 is completed.

The surface electrode pattern 51 is positioned on a portion of the second bus bar electrode pattern 52 adjacent to the surface electrode pattern 51 and may overlap the portion of the second bus bar electrode pattern 52. The surface electrode pattern 51 may not be formed at an edge of the back surface of the substrate 110.

When the substrate 110 is of the p-type, the surface electrode pattern 51 may be formed using an aluminum-containing paste. Alternatively, when the substrate 110 is of the n-type, the surface electrode pattern 51 may be formed using a paste containing Al—Ag or a silver-containing paste.

A drying temperature of the patterns 51 and 52 may be about 120° C. to 200° C., and formation order of the patterns 51 and 52 may vary, if desired.

Next, a thermal process is performed on the substrate 110, on which the second electrode pattern 50 is formed, at a temperature of about 750° C. to 800° C.

Hence, a second electrode 150 including a surface electrode 151 electrically connected to the substrate 110 and a plurality of second bus bar electrodes 152 connected to the substrate 110 and the surface electrode 151, and a surface field region 172, which contacts the surface electrode 151 and is positioned at the back surface of the substrate 110, are formed.

The surface electrode pattern 51 and the second bus bar electrode pattern 52 of the second electrode pattern 50 chemically couple with the substrate 110 due to the thermal process of the substrate 110, and thus, become the surface electrode 151 and the second bus bar electrodes 152. In this instance, because the surface electrode pattern 51 chemically couples with the second bus bar electrode pattern 52 due to the thermal process of the substrate 110, the electrical connection between the surface electrode 151 and the second bus bar electrode 152 is carried out.

During the thermal process, aluminum (Al) or silver (Ag) contained in the surface electrode pattern 51 is diffused into the substrate 110 to form an impurity doped region, i.e., the surface field region 172 having an impurity doping concentration higher than the substrate 110 at the back surface of the substrate 110. Hence, the surface electrode 151 contacts the surface field region 172 having the conductivity greater than the substrate 110 and is electrically connected to the substrate 110. As a result, the collection of carriers from the substrate 110 is more easily carrier out.

In the embodiment of the invention, because the selective emitter region 121 is formed only at the front surface of the substrate 110, an edge isolation process for isolating the electrical connection of an emitter region formed at the back surface of the substrate 110 or a separate process for removing the emitter region formed at the back surface of the substrate 110 is not necessary. Thus, manufacturing time and manufacturing cost of the solar cell are reduced, and the productivity of the solar cell is improved.

In the embodiment of the invention, after the first electrode 140 including the first finger electrodes 141 and the first bus bar electrodes 142 is formed, the second electrode 150 including the surface electrode 151 and the second bus bar electrodes 152 is formed. On the contrary, after the second electrode 150 is formed, the first electrode 140 may be formed.

As described above, because the first finger electrodes 141 are formed using the plating method, the width of each finger electrode 141 formed using the plating method is less than the width of each finger electrode formed using the screen printing method. Hence, the incidence area of the solar cell increases. As a result, the efficiency of the solar cell is improved.

Unlike the embodiment of the invention, when the emitter region 121 does not have the selective emitter structure, namely, the emitter region 121 has the same sheet resistance irrespective of its location so that a sheet resistance of the emitter region 121 underlying the first electrode 140 is substantially equal to a sheet resistance of the emitter region 121 underlying the first dielectric layer 130, the process for forming the impurity layer is omitted in the above-described manufacturing processes of the solar cell.

Accordingly, immediately after the first dielectric layer 130 is formed on the impurity region 120, the laser beam is irradiated onto the first dielectric layer 130 to form the plurality of openings 131 to 134 in the first dielectric layer 130.

In this instance, a separate impurity layer capable of additionally injecting impurities of the second conductive type into the impurity region 120 does not exist on and under the first dielectric layer 130. Further, the irradiation of the laser beam is not to additionally dope the impurities of the second conductive type but to remove only a desired portion of the first dielectric layer 130. Therefore, an extra impurity doping process is not performed on an irradiation portion of the impurity region 120, onto which the laser beam is irradiated.

Accordingly, an irradiation portion and a non-irradiation portion of the impurity region 120 may have the same impurity doping concentration and the same sheet resistance.

Because the irradiation reason of the laser beam is different from the description with reference to FIG. 3B, a wavelength of the laser beam used may be about 355 nm. Further, power (about 5 W to 20 W) and irradiation time of the laser beam used may be determined depending on the material or the thickness of the first dielectric layer 130.

In this instance, because processes for forming and removing the impurity layer 20 are omitted, manufacturing time and manufacturing cost of the solar cell are reduced.

In the embodiment of the invention, the surface electrode 151 is formed using a paste containing aluminum (Al) or silver (Ag) through the screen printing method, and the second bus bar electrodes 152 are formed using a paste containing silver (Ag) through the screen printing method.

In an alternative example, the surface electrode 151 and the second bus bar electrodes 152 may be formed using the plating method in the same manner as the first finger electrodes 141 and the first bus bar electrodes 142.

In the solar cell according to the embodiment of the invention, one first opening 131 and the plurality of second openings 132 are positioned under one first finger electrode 141, and one third opening 133 and the plurality of fourth openings 134 are positioned under one first bus bar electrode 142. Alternatively, the plurality of third openings 133 may be positioned under one first bus bar electrode 142.

Figure 7:
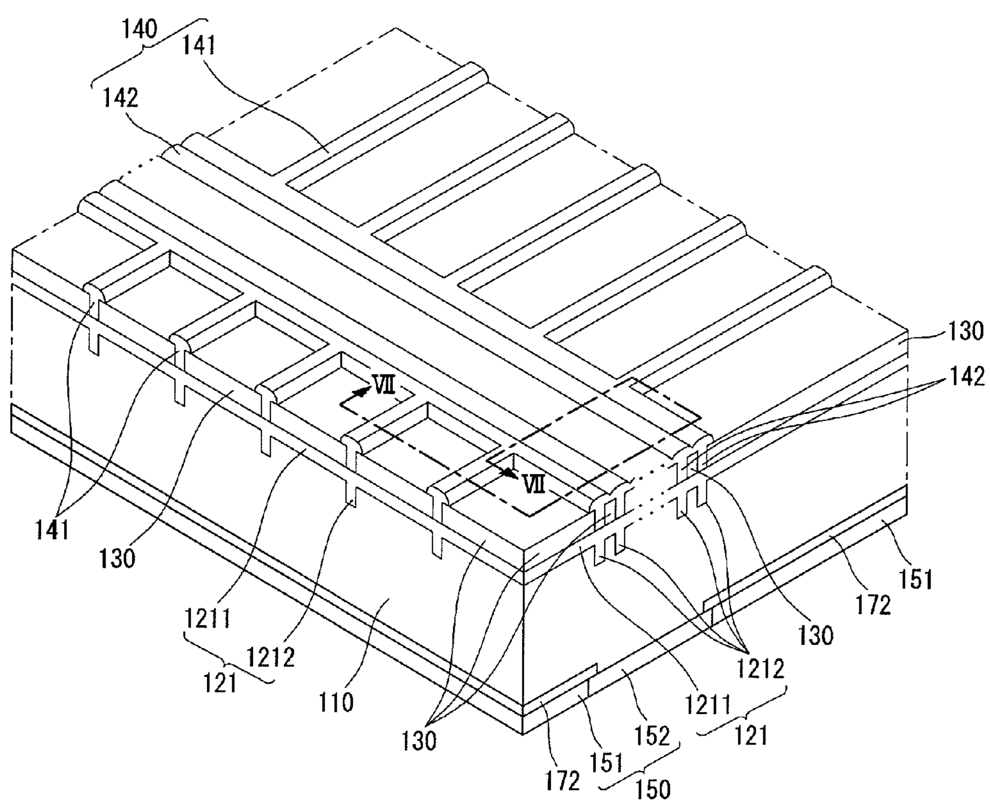
FIG. 7 is a partial perspective view of a modification of the solar cell according to the first embodiment of the invention.
Figure 8:
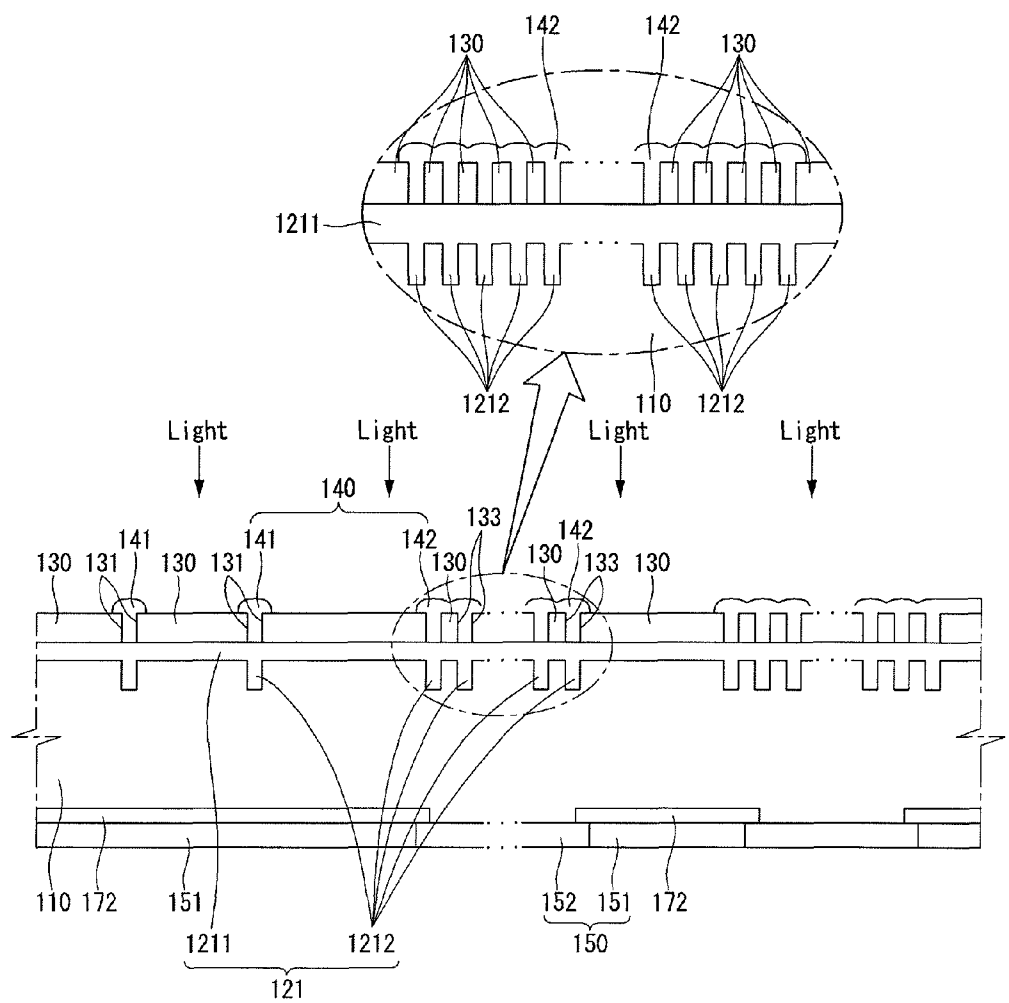
FIG. 8 is a cross-sectional view taken along line VII-VII of FIG. 7.

FIGS. 7 and 8 illustrate a modification of the solar cell according to the first embodiment of the invention. A difference between the modification and the first embodiment of the invention is that the plurality of third openings 133 are positioned under one first bus bar electrode 142, and other configurations are substantially the same as each other. Thus, structures and components identical or equivalent to those described in the above solar cell are designated with the same reference numerals in the modification, and a further description may be briefly made or may be entirely omitted.

As shown in FIGS. 7 and 8, the plurality of third openings 133 are positioned under one first bus bar electrode 142. Although not shown, the plurality of fourth openings 134 are positioned on both sides of the third opening 133.

In the embodiment of the invention, the first and third openings 131 and 133 are formed using the same laser beam. Because a width W22 of the first bus bar electrode 142 is greater than a width W12 of the first finger electrode 141, the plurality of third openings 133 are formed under one first bus bar electrode 142.

In this instance, the plurality of third openings 133 underlying the first bus bar electrode 142 may be positioned at a uniform distance therebetween. Alternatively, the plurality of third openings 133 may be positioned at a non-uniform distance therebetween.

Because the plurality of third openings 133 are positioned under one first bus bar electrode 142, the same number of heavily doped region 1212 as the third openings 133 are formed under the first bus bar electrode 142.

In the process for forming the first bus bar electrode 142 according to the first embodiment of the invention, instead of entirely removing the first dielectric layer 130 of an area to form one first bus bar electrode 142 using the laser beam, the first dielectric layer 130 of an area to form one first bus bar electrode 142 is partially or selectively removed using the laser beam to thereby form the first bus bar electrodes 142. Thus, the irradiation area of the first dielectric layer 130, onto which the laser beam is irradiated, decreases.

Hence, the degradation of the emitter region 121 or the substrate 110 resulting from heat applied by the laser beam is prevented or reduced. Further, manufacturing time of the solar cell is reduced, and the characteristic changes of the solar cell are prevented or reduced.

In the embodiment of the invention, when the number of third openings 133 used to form one first bus bar electrode 142 is equal to or greater than 30, the first bus bar electrode 142 having the stable electrical conductivity and the surface area is formed. Further, when the number of third openings 133 used to form one first bus bar electrode 142 is equal to or less than 70, unnecessary time is saved, and the irradiation area of the laser beam is reduced.

A solar cell according to a second embodiment of the invention is described below with reference to FIG. 9. The solar cell according to the embodiment of the invention has the structure, in which light is incident on one (the front surface in the embodiment of the invention) of the front surface and the back surface of the substrate 110. Alternatively, as shown in FIG. 9, the solar cell according to the embodiment of the invention may be applied to a bifacial solar cell, in which light is incident on both the front surface and the back surface of the substrate 110.

Figure 9:
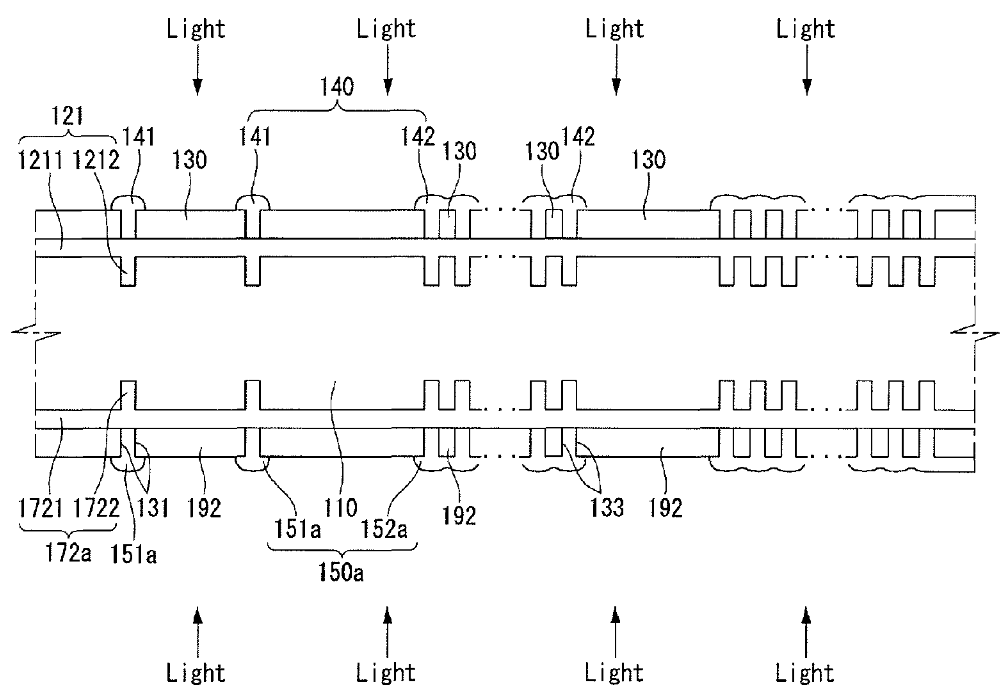
FIG. 9 is a partial cross-sectional view of a solar cell according to a second embodiment of the invention.

As shown in FIG. 9, the bifacial solar cell according to the embodiment of the invention includes a second dielectric layer 192 having a plurality of first to fourth openings 131 to 134 on a back surface of a substrate 110, and a surface field region 172*a* which is positioned at the back surface of the substrate 110 underlying the second dielectric layer 192 and is more heavily doped than the substrate 110 with impurities of the same conductive type as the substrate 110. A first portion of the surface field region 172*a* is exposed through the plurality of first openings 131, and a second portion of the surface field region 172*a* is exposed through the plurality of third openings 133.

The surface field region 172*a* has a structure similar to a selective emitter structure. Thus, the surface field region 172*a* includes first and second field regions (or first and second impurity regions) 1721 and 1722 each having a different impurity doping concentration and a different sheet resistance depending on its location.

For example, an impurity doping concentration of the second field region 1722 is higher than an impurity doping concentration of the first field region 1721, and a sheet resistance of the second field region 1722 is less than a sheet resistance of the first field region 1721.

The second field region 1722 of the surface field region 172*a* is a portion of the surface field region 172*a* exposed through the plurality of first and third openings 131 and 133. The first field region 1721 of the surface field region 172*a* is a portion of the surface field region 172*a* underlying the second dielectric layer 192.

Similar to a first dielectric layer 130, the second dielectric layer 192 performs a passivation function, which solves a defect existing at and around the back surface of the substrate 110. Further, the second dielectric layer 192 serves as a reflection layer which reflects light passing through the substrate 110 onto the substrate 110. The second dielectric layer 192 may be formed of hydrogenated silicon nitride (SiNx:H) or aluminum oxide ($Al_2O_3$), etc.

Similar to a first electrode 140, a second electrode 150*a* includes a plurality of second finger electrodes 151*a*, which are separated from one another, and a plurality of second bus bar electrodes 152*a*, which are separated from one another and are connected to the plurality of second finger electrodes 151*a*.

Each of the second finger electrodes 151*a* extends in the same direction as each first finger electrode 141, and each of the second bus bar electrodes 152*a* extends in the same direction as each first bus bar electrode 142.

Thus, each second bus bar electrode 152*a* is connected to the plurality of second finger electrodes 151*a* at crossings of each second bus bar electrode 152*a* and the plurality of second finger electrodes 151*a*.

Accordingly, because the second finger electrodes 151*a* and the second bus bar electrodes 152*a* contact the second field region 1722 having the impurity doping concentration higher than the first field region 1721, a transfer efficiency of carriers moving from the substrate 110 to the second finger electrodes 151*a* and the second bus bar electrodes 152*a* is improved.

In the embodiment of the invention, one third opening 131 is used to form each second finger electrode 151*a* similar to each first finger electrode 141, and the plurality of third openings 133, for example, the 30 to 70 third openings 133 may be used to form each second bus bar electrode 152*a* similar to each first bus bar electrode 142.

In this instance, the number of second finger electrodes 151*a* may be equal to or more than the number of first finger electrodes 141.

The second electrode 150*a* is formed by performing a plating process on the second field region 1722 exposed through the plurality of openings 131 to 134 in the same manner as the first electrode 140.

Similar to the emitter region 121, a surface field region having an uniform sheet resistance and an uniform impurity doping concentration irrespective of the location may be used instead of the surface field region 172*a* including the first and second field regions 1721 and 1722.

In the embodiment of the invention, a formation process of the surface field region 172*a* is substantially the same as the emitter region 121 except the material used, and a formation process of the second electrode 150*a* is substantially the same as the first electrode 140. Therefore, a further description may be briefly made or may be entirely omitted.

In the bifacial solar cell according to the embodiment of the invention, because light is incident on both the front surface and the back surface of the substrate 110, an amount of light incident on the substrate 110 increases. Hence, the efficiency of the bifacial solar cell is improved.

The embodiments of the invention have described the solar cell, in which the emitter region 121 and the surface field region 172 (or 172*a*) are formed of the same semiconductor (i.e., crystalline semiconductor) as the substrate 110 and form the homojunction along with the substrate 110. However, the emitter region 121 and the surface field region 172 (or 172*a*) may form heterojunction along with the substrate 110.

In case of the heterojunction, a substrate may be formed of a crystalline semiconductor such as single crystal silicon and polycrystalline silicon, and at least one of an emitter region and a surface field region may be formed of a noncrystalline semiconductor such as amorphous silicon.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:

a substrate;

a selective emitter region positioned at the substrate, the selective emitter region including a lightly doped region and a heavily doped region;

a first dielectric layer positioned on the selective emitter region, the first dielectric layer including a plurality of first openings, which are separated from one another, and a plurality of second openings positioned around the plurality of first openings;

a plurality of first finger electrodes separated from one another and extending parallel to one another; and a second electrode which is positioned on the substrate and is connected to the substrate, wherein the plurality of first openings and the plurality of second openings each have a different plane shape, wherein each first finger electrode of the plurality of first finger electrodes is connected to the selective emitter region through the plurality of first openings and the plurality of second openings, wherein the plurality of second openings are associated with and positioned on both sides of each one of the plurality of first openings, wherein the selective emitter region has a substantially flat surface and a textured surface, and wherein each of the first openings of the plurality of first openings is positioned on the substantially flat surface of the selective emitter region, and each of the second openings of the plurality of second openings is positioned on the textured surface of the selective emitter region.

2. The solar cell of claim 1, wherein the plane shape of the plurality of first openings has a line shape, and the plane shape of the plurality of second openings has a dot shape.

3. The solar cell of claim 1, wherein a width of each first opening is about 8 μm to 12 μm, and wherein a maximum distance between two of the plurality of second openings positioned on each of both sides of the each first opening is about 10 μm to 25 μm.

4. The solar cell of claim 1, wherein the heavily doped region of the selective emitter region has the same plane shape as the plurality of first openings.

5. The solar cell of claim 1, further comprising;

a plurality of first bus bar electrodes, which are positioned on a first surface of the substrate and are formed in a direction crossing the plurality of first finger electrodes.

6. The solar cell of claim 5, wherein the first dielectric layer includes at least one third opening and a plurality of fourth openings positioned around the at least one third opening, and wherein each first bus bar electrode of the plurality of first bus bar electrodes is connected to the selective emitter region through the third and fourth openings.

7. The solar cell of claim 6, wherein the at least one third opening is positioned under one first bus bar electrode.

8. The solar cell of claim 6, wherein at least two third openings are positioned under one first bus bar electrode.

9. The solar cell of claim 6, wherein a remaining area of the first surface of the substrate excluding a formation area of the first and third openings has a textured surface.

10. The solar cell of claim 9, wherein the formation area of the first and third openings in the first surface of the substrate has a substantially flat surface.

11. The solar cell of claim 9, wherein the first dielectric layer is positioned between the at least one third opening and the plurality of fourth openings.

12. The solar cell of claim 5, wherein the second electrode includes a plurality of second bus bar electrodes, which are positioned on a second surface opposite the first surface of the substrate at a location corresponding to the plurality of first bus bar electrodes, and a surface electrode, which is positioned between the second bus bar electrodes on the second surface of the substrate, and wherein the surface electrode entirely covers the second surface between the second bus bar electrodes.

13. The solar cell of claim 5, wherein the second electrode includes a plurality of second bus bar electrodes, which are positioned on a second surface opposite the first surface of the substrate at a location corresponding to the plurality of first bus bar electrodes, and a plurality of second finger electrodes which are positioned on the second surface of the substrate and are formed in a direction crossing the second bus bar electrodes.

14. The solar cell of claim 1, wherein the first dielectric layer is positioned between the plurality of first openings and the plurality of second openings.

15. The solar cell of claim 1, wherein the each first finger electrode of the plurality of first finger electrodes includes a seed layer positioned on surfaces of the selective emitter region exposed through the plurality of first openings and the plurality of second openings, and a conductive metal layer positioned on the seed layer.

16. The solar cell of claim 15, wherein the seed layer contains nickel (Ni), and the conductive metal layer contains copper (Cu) and tin (Sn) or contains silver (Ag).

17. The solar cell of claim 1, wherein a maximum distance from a set of the plurality of second openings to an associated first one of the plurality of first openings is smaller than a distance from that associated first one of the plurality of first openings to a second one of the plurality of first openings adjacent to the first one of the plurality of first openings.

* * * * *